United States Patent
Ayoub et al.

(10) Patent No.: US 9,293,628 B2
(45) Date of Patent: Mar. 22, 2016

(54) STRESSED SEMICONDUCTOR DETECTOR WITH PIEZOELECTRICAL COMPONENT

(71) Applicant: Kromek Limited, Sedgefield (GB)

(72) Inventors: Mohamed Ayoub, Sedgefield (GB); Ian Radley, Sedgefield (GB)

(73) Assignee: Kromek Limited, Sedgefield (GB)

(*) Notice: Subject to any disclaimer, the term of this patent is extended or adjusted under 35 U.S.C. 154(b) by 0 days.

(21) Appl. No.: 14/420,627

(22) PCT Filed: Aug. 14, 2013

(86) PCT No.: PCT/GB2013/052154
§ 371 (c)(1),
(2) Date: Feb. 9, 2015

(87) PCT Pub. No.: WO2014/027192
PCT Pub. Date: Feb. 20, 2014

(65) Prior Publication Data
US 2015/0194560 A1 Jul. 9, 2015

(30) Foreign Application Priority Data

Aug. 15, 2012 (GB) .................................. 1214567.8

(51) Int. Cl.
*G01T 1/26* (2006.01)
*H01L 31/115* (2006.01)
*G01T 1/24* (2006.01)
(Continued)

(52) U.S. Cl.
CPC ............... *H01L 31/115* (2013.01); *G01T 1/24* (2013.01); *H01L 31/02966* (2013.01); *H01L 31/032* (2013.01); *H01L 31/0304* (2013.01); *H01L 31/03046* (2013.01); *H01L 31/18* (2013.01);
(Continued)

(58) Field of Classification Search
CPC .............. G01L 9/08; G01L 1/16; G01L 9/008
See application file for complete search history.

(56) References Cited

U.S. PATENT DOCUMENTS 3,743,953 A * 7/1973 Ganguly ................. H03F 13/00
330/4.6
6,114,698 A * 9/2000 Lehman ................... G01J 5/34
250/338.3

(Continued)

FOREIGN PATENT DOCUMENTS

FR      2372440 A1   6/1978
GB       808630 A    2/1959
WO   WO-2010133869 A1   11/2010

OTHER PUBLICATIONS

Hwang et al., "Temperature dependence of the Faraday rotation in diluted magnetic semiconductor Cd1-x-yMnxZnyTe crystal," 2006, Journal of Magnetism and Magnetic Materials, vol. 304, pp. e312-e314.*

(Continued)

*Primary Examiner* — Kiho Kim
(74) *Attorney, Agent, or Firm* — Winstead PC

(57) ABSTRACT

A semiconductor detector device comprising: a detector element comprising at least one active detector layer of piezoelectric semiconductor material; a stress inducing element arranged to act in use on the detector element to generate therein a predetermined pattern of stress, and consequently a predetermined electrical field via the piezoelectric effect. A method of fabrication and of operation of a semiconductor detector device embodying these principles are also described.

21 Claims, 2 Drawing Sheets

(51) Int. Cl.
*H01L 31/0296* (2006.01)
*H01L 31/0304* (2006.01)
*H01L 31/032* (2006.01)
*H01L 31/18* (2006.01)

(52) U.S. Cl.
CPC .......... *H01L 31/184* (2013.01); *H01L 31/1832* (2013.01); *H01L 31/1844* (2013.01)

(56) References Cited

U.S. PATENT DOCUMENTS

| | | |
|---|---|---|
| 6,359,281 B1 | 3/2002 | Pawlak et al. |
| 6,376,971 B1 | 4/2002 | Pelrine et al. |
| 6,420,706 B1 * | 7/2002 | Lurie ................. G01J 5/20 250/338.1 |
| 6,652,905 B2 * | 11/2003 | Kashiwaya ........... C04B 35/493 29/25.35 |
| 7,223,981 B1 | 5/2007 | Capote et al. |
| 7,618,188 B2 * | 11/2009 | Glaser ................. G01L 1/16 374/197 |
| 2003/0138987 A1 | 7/2003 | Nemirovsky et al. |
| 2003/0164888 A1 | 9/2003 | Orava et al. |
| 2007/0003006 A1 | 1/2007 | Tkaczyk et al. |
| 2007/0170851 A1 | 7/2007 | Yaegashi |

OTHER PUBLICATIONS

Datskos et al., "Detection of infrared photons using the electronic stree in metal-semiconductor cantilever interfaces," 200, Ultramicroscopy, vol. 82, pp. 49-56.*

Johnstone, John, "International Search Report," prepared for PCT/GB2013/052154, as mailed Dec. 13, 2013, four pages.

Mohammed, Ahmed A.S., et al., "Optimization of Geometric Characteristics to Improve Sensing Performance of MEMS Piezoresistive Strain Sensors," Journal of Micromechanics & Microengineering, Institute of Physics Publishing, Bristol, GB, vol. 20, No. 1, Dec. 2, 2009, pp. 1-15.

Bykhovski, A. D., et al., "Piezoresistive Effect in Wurtzite n-type GaN," Applied Physics Letters, American Institute of Physics, vol. 68, No. 6, Feb. 5, 1996, pp. 818-819.

Baxter, Richard D.; "Miniature Hybrid Preamplifier for CdTe Detectors"; IEEE Transactions on Nuclear Science, vol. 23, No. 1; Feb. 1976; pp. 493-497.

* cited by examiner

STRESSED SEMICONDUCTOR DETECTOR WITH PIEZOELECTRICAL COMPONENT

The invention relates to a semiconductor detector device, and to a method of operation and/or fabrication of a semiconductor detector device. In particular the invention preferably relates to a semiconductor detector for the detection of radiation and especially for high energy physics applications, such as a detector for high energy electromagnetic radiation such as x-rays and/or gamma rays. In particular the invention preferably relates to a semiconductor detector device having a detection area defining a plurality of separately addressed regions or pixels (that is, the detector is a pixellated detector).

Semiconductor based detector devices are widely used for the detection of radiation for a range of applications.

There has been increased use in recent years of alternative compound semiconducting materials for semiconductor detector devices, in particular for higher energy applications. This includes for example detector devices including group II-VI semiconductors such as semiconductors of the cadmium telluride type (including for example cadmium telluride, cadmium zinc telluride (CZT), cadmium manganese telluride (CMT), mercury cadmium telluride, mercury zinc telluride and alloys thereof), and other compound semiconductors such as, for example, gallium arsenide, indium gallium arsenide, lanthanum bromide, thorium bromide. For example, bulk single crystal cadmium telluride, CZT, CMT lanthanum bromide and thorium bromide semiconductors are known to be useful of x-ray and gamma-ray detectors which have application in security screening, medical imaging and space exploration amongst other things. Cadmium mercury telluride, mercury zinc telluride, and indium gallium arsenide are useful in particular in the infra-red.

Pixellated radiation detector structures comprising a detector material having a pixellated structure to define a plurality of discretely addressable individual elements across an area of detector material, typically to convert an area modulated incident radiation into an area modulated photoelectric response, have found increasing application in recent years. The principle is used for instance in silicon or other semiconductor based charge coupled devices (CCDs) for use in digital photography, optical and IR spectroscopy and the like, and in higher energy applications for example for X-ray and CT imaging and like applications.

For example, a detector device may be provided comprising a semiconductor detector element defining a two dimensional multiple array of small pixels (for example with a 200 μm to 1 mm pitch) which may be mounted to a suitable contact by means of which each pixel element may be addressed separately, for example by bump bonding to a suitable ASIC that amplifies the signal from each pixel.

Such a small pixel device can benefit from the known "small pixel effect". In a simple plane parallel device, charges distributed evenly through the thickness. In a plural small pixel device, the charge distribution tends to become much more non-linear. The small pixel effect affects how the charge signal is induced in the positive contact, and tends to produce a tighter resolution in the device. The shape of the charge experienced locally to the positive contact for each pixel is the key to controlling the small pixel effect, in particular considering the design of the contact versus thickness and the contact size versus thickness. In pixellated devices it is accepted that it is generally desirable to develop devices where the small pixel effect is exploited and enhanced.

In accordance with the invention in the first aspect there is provided a semiconductor detector device comprising:

a detector element comprising at least one active detector layer of piezoelectric semiconductor material;

a stress inducing element arranged to act in use on the detector element to generate therein a predetermined pattern of stress, and consequently a predetermined electrical field.

Although this aspect of the invention is not to be considered limited to a particular mechanism of operation it can be noted that a predetermined electrical field may be generated in particular via the piezoelectric effect and/or by appropriate control of the effect of intrinsic defects. Thus, the invention at its broadest comprises a device which is inherently adapted to enable in use the generation within a detector element of a patterned electrical field, for example by exploiting the inherent piezoelectric properties of the detector element in a controlled manner and/or by appropriate control of the effect of intrinsic defects, so as to modify the electrical behaviour of the detector. In particular, the application of a predetermined pattern of stress permits the generation of a predetermined varied electrical field and thus various electrical transports properties of electrons and holes which can modify the performance of the detector differently in specific areas.

The stress inducing element acts in use across at least a part of the surface of an area detector, and thereby selectively modifies properties thereof by generating in use a patterned variable electrical field. It may do so mechanically by direct force or pressure application to produce strain, actively in use by direct force application or passively by mechanical pre-stressing, or indirectly by otherwise creating strain within the structure, for example by inducing thermal changes that create material stresses by exploiting differential thermal expansion within a detector element or between a detector element and other device components, and may do so to generate static or dynamically varying material stresses, without departing from the principles of the invention. Rather, the key to the invention is that, however created, there may be generated during use a controlled and selective predetermined pattern of stress that generates a consequently controlled and selective predetermined patterned electrical field.

It is known in the prior art that a large number of semiconductor detector materials, in particular those fabricated from compound semiconductors, exhibit piezoelectric properties. Conventionally, the piezoelectric properties of such detector elements have been considered a potential problem. In a practical detector, any active layer of detector material must typically find itself in mechanical relationship with a variety of other layers, for example supporting substrates, housings, contact devices such as ASICs, and the like. The piezoelectric semiconductor material is typically mounted by an appropriate mounting process, for example by bump bonding. Strain induced in the semiconductor detector element, whether as a result of pre-stressing effects through the mounting, or as a result of stresses generated during use, for example mechanically, via thermal expansion effects etc, generates electrical fields in an uncontrolled manner within the device which are detrimental to its operation.

Various solutions in the prior art attempt to mitigate or accommodate these detrimental aspects of the piezoelectric properties of such detector elements. For example, an applied stress applied for example mechanically or acoustically during fabrication followed by annealing might be used to improve detector performance. Modifications might be made to the bump bonding or like mounting processes to reduce induced stresses during fabrication or use. The effects of the piezoelectric property on the function of such detector elements are known. However the prior art treats them as detrimental effects to be mitigated or accommodated, but not to be desired.

By contrast, in accordance with the invention, this property of the detector element which was previously considered potentially detrimental and something to be avoided or dealt with by remedial action is specifically exploited by the deliberate inducing of predetermined stress patterns in use in the piezoelectric detector element to deliberately generate predetermined variable electrical field patterns therein, and thereby produce a controlled variation in performance which can thus be made beneficial to device operation by appropriate selection of predetermined stress patterns.

A predetermined stress pattern is used to generate a desired patterned electrical field selectively to modify the device response of specific areas of the detector element, for example to mitigate local detrimental effects such as edge effects or to enhance local positive effects.

The piezoelectric effect is specifically and deliberately induced during use, by the deliberate inducing of predetermined stress patterns, rather than being treated as something to reduce, accommodate or mitigate. Controlled stresses and pressures exploit the piezoelectric effect on the detector to improve the performance of the detector. The stresses have an impact on the electrical defects, the electrical field, and the piezoelectric effect, modifying the concentration and energy of the surface defects as well as those in the band gap, the electrical field form between the two electrodes, and the mobility-life time of the electron and holes leading to the controlled improvement of leakage current, transport properties and gamma performance of the detectors.

Application of a controlled mechanical stress on the device (metallic contact/interface/semiconductor) or from the edge side of the device allows a user to control and modify the intrinsic defect concentration and/or energy leading to a better compensation of charges and thus to an improvement of electrical field form through the device. This can control and/or improve the device performance in terms of energy resolution (FWHM) and efficiency. The controlled stress can be applied on a planar detector as well as on a pixellated one.

However in the preferred case, the detector element is a pixellated detector element, and the induced stress pattern is selectively induced at least to complement/enhance the small pixel effect.

In this preferred case, a detector element comprises a pixellated detector, defining (for example by appropriate arrangement of contacts, insulators etc as will be familiar) a plurality of separately addressed sub-elements in at least one direction and preferably in a two dimensional and for example square array. Pixellated detector structures are well known, and the invention is not intended to be limited to particular patterns of pixel.

The stress inducing element is so configured as to generate a predetermined stress pattern, and consequently predetermined electrical field pattern, which is such as to complement the small pixel effect in such a pixellated device. For example, the predetermined pattern is generated on a pixel scale.

In the particular preferred case, pixels define a repeat distance or pitch in that they are evenly spaced in at least one direction, and the predetermined pattern is a repeating pattern that repeats with the same pitch as the pixel pitch. Preferably, the pixels comprise a two dimensional array, and the predetermined pattern is a repeating pattern that repeats on the same pitch as the pixel pitch in the two dimensions.

The electrical field thus generated is a field with a pixel scale pattern, and for example a pattern which repeats by pixel pitch. For example the pixels comprise a two dimensional array, and the electrical field pattern is a repeating pattern that repeats on the same pitch as the pixel pitch in the two dimensions.

Such an electrical field pattern can be used to control and modify the small pixel effect on a pixel by pixel scale. For example, a device may be produced in which the small pixel effect, and the resultant benefits of device resolution, are enhanced and/or may be used in a device to mitigate the effects of other device modifications that might otherwise be detrimental to the small pixel effect.

In a preferred embodiment, the detector element has a micropixellated pattern. The stress inducing element is so configured as to generate a microstress pattern with the same repeat pitch.

The invention at its broadest lies in the provision of some form of stress inducing element to induce a patterned stress, and thereby produce the appropriate patterned electrical field via the piezoelectric effect in the piezoelectric detector element. The invention is not limited by the particular implementation of this, or by a particular configuration of stress inducing element.

In a possible case, a stress inducing element is adapted in use to act mechanically upon the detector element to produce appropriate mechanical stress patterns therein during use. A stress inducing element that is adapted in use to act mechanically upon the detector element may do so directly or via engagement mechanically through other structures such as further active, passive or substrate layers, device housings and the like.

In an alternative case a stress inducing element may be a part of a device structure, for example to induce a pre-stress to the device, and the invention encompasses in this regard both separate elements having such activity and the provision of an inherent pre-stress to the detector element itself, whereby the detector element itself serves also as the stress inducing element.

Embodiments of the invention can be envisaged where the stress inducing element is so configured as to induce an inherent pre-stress in the detector element to generate the appropriate stress pattern and/or where the stress inducing element applies a deformation force dynamically during use, for example under user control. A stress pattern may be induced in uniform manner or area by area, for example under selective user control. For example, in the pixellated case, stress may be generated dynamically uniformly over a large area or pixel by pixel as required.

It can be envisaged that a stress inducing element might comprise one or more of a substrate layer on which the detector element may be mounted with an appropriate pre-stress pattern, a substrate layer on which the detector element may be mounted, which layer is so configured as to generate an appropriate stress pattern on application of an external force from a force applicator, and a discrete force applicator configured to act selectively during use upon the detector element to generate an appropriate stress pattern.

In one possible embodiment, the device comprises a supporting substrate mechanically engaged with the detector element in such a manner as to induce an appropriate predetermined stress pattern in use, for example being bonded thereto to induce pre-stresses generating an appropriate stress pattern and/or being structured such that the required stress pattern is inherently generated on application of an external force.

For example, a substrate is a planar substrate with a suitably patterned surface comprising a pattern of projections and recesses, such as a combination of dimples, pins and the like, which presents a contact surface with an selectively contacts the detector element. Such a patterned surface substrate may be bonded to the detector element, for example in such a manner as to induce patterned pre-stresses and/or may be disposed to be acted upon in use by a forced applicator, for example applying pressure to an opposite surface thereof, to induce stress patterns within the detector element.

Additionally or alternatively the detector element may be co-operatively disposed with a force applicator that mechanically engages selectively in use with the detector element to apply a force thereto and generate a patterned stress therein. Again, for example, the force applicator could comprise a shaped surface structure having a suitable patterned arrangement of projections and recesses so as to generate stress patterns of a predetermined nature when pressed against the detector element.

Additionally or alternatively to the use a shaped surface in this manner, a force applicator substrate or a discrete force applicator may comprise a further piezoelectric element mechanically engageable with the detector element and provided with a means to selectively apply an electrical field to the substrate/force applicator to generate a mechanical distortion therein, and thereby apply predetermined mechanical patterned stress to the detector element.

In accordance with either of these alternatives, potentially complex mechanically produced stress patterns are possible, and in particular stress patterns are possible in which separate areas of the detector are separately controlled, and for example in the preferred case in which separate pixels are separately controlled.

Additionally or alternatively the stress inducing element may act without mechanical engagement with the detector element otherwise to creating stress within the detector element structure. For example, differential thermal expansion between a detector element and other device components such as between a detector element and a substrate on which the detector element is mounted and/or between layers of a detector element may be exploited in order to generate stress in use. By appropriate selection of such substrate or layers, and by provision of a means to apply controlled variations in temperature to the device during use, an additional mechanism to induce strain patterns in the detector element during use can be provided.

For example a stress inducing element may comprise a heat source that creates thermal changes in the environment of the detector element and acts to induce stresses by exploiting differential thermal expansion within a detector element or between a detector element and other device components such as a device substrate on which the detector element is mounted, further device layers etc.

In a possible arrangement, differential expansion coefficients and thermal effects may be used to induce stresses in one direction, and applied mechanical force may be used to induced stresses in another direction.

In a preferred case, a force applicator is adapted to produce a static pressure in use so as to generate steady state loading conditions. In an alternative case, a force applicator may additionally be adapted to apply a dynamically varying pressure and/or to apply differential pressure to different areas of the device.

A range of applications can be envisaged for a device in accordance with the invention, in particular in the preferred embodiment comprising those applications where a pixellated device with multiple small pixels is desirable. Suitable fields include the field of radiation detection, the field of high resolution spectroscopy, and applications where high counted rate large area detectors are required, such as for medical CT. However, the invention is not limited by particular application.

The invention is applicable to detector elements fabricated from any material in which the piezoelectric effect can be exploited to generate a predetermined stress pattern to control the electrical behaviour of a detector element fabricated therefrom, and for example to modify the small pixel effect.

Many compound semiconducting materials for example exhibit suitable piezoelectric properties. These include for example group II-VI semiconductors such as semiconductors of the cadmium telluride type (including for example cadmium telluride, cadmium zinc telluride (CZT), cadmium manganese telluride (CMT), mercury cadmium telluride, mercury zinc telluride and alloys thereof), and other compound semiconductors such as, for example, gallium arsenide, indium gallium arsenide, lanthanum bromide, thorium bromide. Materials making up the semiconductor element of the invention preferably include one or more piezoelectric semiconductor from the above list.

The materials making up the semiconductor detector element are in particular preferably selected from cadmium telluride, cadmium zinc telluride (CZT), cadmium manganese telluride (CMT), germanium, lanthanum bromide, thorium bromide. Group II-VI semiconductors, and especially those listed, are particularly preferred in this regard. The materials making up the semiconductor detector element are preferably selected from cadmium telluride, cadmium zinc telluride (CZT), cadmium manganese telluride (CMT) and alloys thereof, and for example comprise crystalline $Cd_{1-(a+b)}Mn_aZn_b Te$ where $a+b<1$ and a and/or b may be zero.

A semiconductor detector element may comprise at least one layer formed as a single crystal and for example as a bulk single crystal (where bulk crystal in this context indicates a thickness of at least 500 µm, and preferably of at least 1 mm).

In accordance with the invention in a further aspect, a method of operation of a detector device comprises the steps of:

providing a detector device comprising at least one detector element having at least one active detector layer of a piezoelectric semiconductor material;

operating the detector element whilst inducing therein a predetermined stress pattern, and consequently inducing therein a predetermined pattern of electrical field.

The method is in particular preferably a method of operation of the device in accordance with the first aspect of the invention, and embodies generally analogous principles, and preferred features of the method will accordingly be understood by analogy with preferred features described herein above in relation to the device of the first aspect of the invention.

In particular, the method comprises, during operation of a detector device incorporating a detector element having at least one piezoelectric semiconductor detector layer, generating an appropriately controlled stress pattern and thereby, via the piezoelectric effect and by controlling the intrinsic defects concentration and/or energy, an appropriately controlled patterned electric field is created allowing modification of the electrical behaviour of the detector, and in particular to modify detector performance in specific areas of the detector.

In the preferred case, the detector is a pixellated detector, in that the detector element is divided into a plurality of separately addressed sub-elements in at least one direction and preferably in a two dimensional array and the stress inducing method step comprises inducing a predetermined pattern of strain such as to generate a patterned electrical field which complements the small pixel effect in the pixellated detector in use. For example, the predetermined pattern is on a pixel scale.

In a particular preferred case, the pixels define a repeat distance or pitch in that they are evenly spaced in at least one direction, and a predetermined stress pattern is applied as a repeating pattern that repeats with the same pitch as the pixel pitch. Preferably, the pixels comprise a two dimensional array, and a predetermined stress pattern is applied as a repeating pattern that repeats on the same pitch as the pixel pitch in the two dimensions.

The electrical field thus generated is a field with a pixel scale pattern, and for example a pattern which repeats by pixel pitch. For example the pixels comprise a two dimensional array, and the electrical field pattern is a repeating pattern that repeats on the same pitch as the pixel pitch in the two dimensions.

Other preferred features of the method of the second aspect will be understood by analogy with the discussion of the device of the first aspect of the invention.

In accordance with the invention in a third aspect, to a method fabrication of a detector device comprises the steps of:
providing a detector device comprising at least one detector element having at least one active detector layer of a piezoelectric semiconductor material;
associating with the detector element a stress inducing element arranged to act in use on the detector element to generate therein a predetermined pattern of stress, and consequently a predetermined electrical field. Although this aspect of the invention is not limited to a particular mechanism it has been noted that a predetermined electrical field is generated in particular via the piezoelectric and controlled intrinsic defects variation effects.

The stress inducing element is conveniently so configured and arranged as in use to act mechanically upon the detector element to produce appropriate mechanical stress patterns therein during use and is in a possible case an external force applicator positioned to act mechanically upon the detector element to apply a force thereto. In an alternative case a stress inducing element may be a part of a device structure, for example to induce a pre-stress to the device, and the invention encompasses in this regard both separate elements having such activity and the provision of an inherent pre-stress to the detector element itself, whereby the detector element itself serves also as the stress inducing element.

The method is in particular preferably a method of fabrication of the device in accordance with the first aspect of the invention, and embodies generally analogous principles, and preferred features of the method will accordingly be understood by analogy with preferred features described herein above in relation to the device of the first aspect of the invention and the method of the second aspect of the invention.

The invention will now be described by way of example only with reference to the accompanying drawings in which.

Figure 1A:
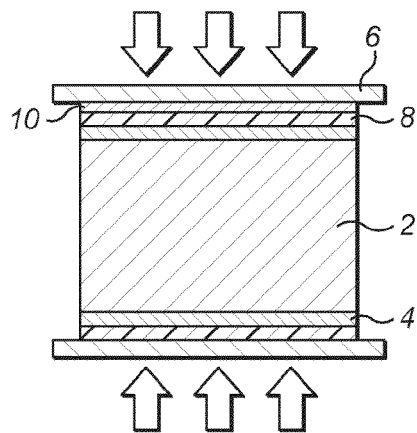
FIG. 1 is a schematic of controlled pressure system used for a planar detector with applied pressure on: a) contact/interface/SC side, b) edge side of the detector.
Figure 1B:
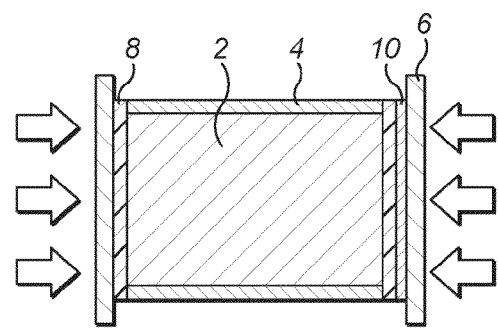

FIGS. 1a and 1b show a schematic of a controlled stress system. The stress is applied, in this example, on a planar detector (2) and either on the contact side (FIG. 1a) or on the edge side (FIG. 1b). The detector (2) is a piezoelectric material for example of the cadmium telluride or cadmium zinc telluride type, and in an example embodiment is CdTe and is provided with a metallic contact (4) on each of two opposing faces.

A stress is applied via rigid plates (6) (which may for example be ceramic, metallic or plastic) disposed on each of two opposing faces either on the contact side (FIG. 1a) or on the edge side (FIG. 1b). A stress is applied through a high dielectric and resistivity soft material layer (8) (such as a silicone rubber or anisotropic layer for example comprising anisotropic tapes) in order to apply a uniform stress on the whole device surface. A pressure gauge (10), inserted between one of the plates (6) and the high dielectric layer (8), is used to measure the applied pressure on the detector. The dielectric layer and plate are held by a clamp or a micrometer screw stage (not shown). The stress in this example is created via a controlled static pressure in the direction of the arrows.

In the illustrated embodiment, as an example only, a stress is applied by an Al plate (6). A silicone rubber (8) has been used between the device surface and the Al plate in order to apply a uniform stress on the whole device surface.

Figure 2:
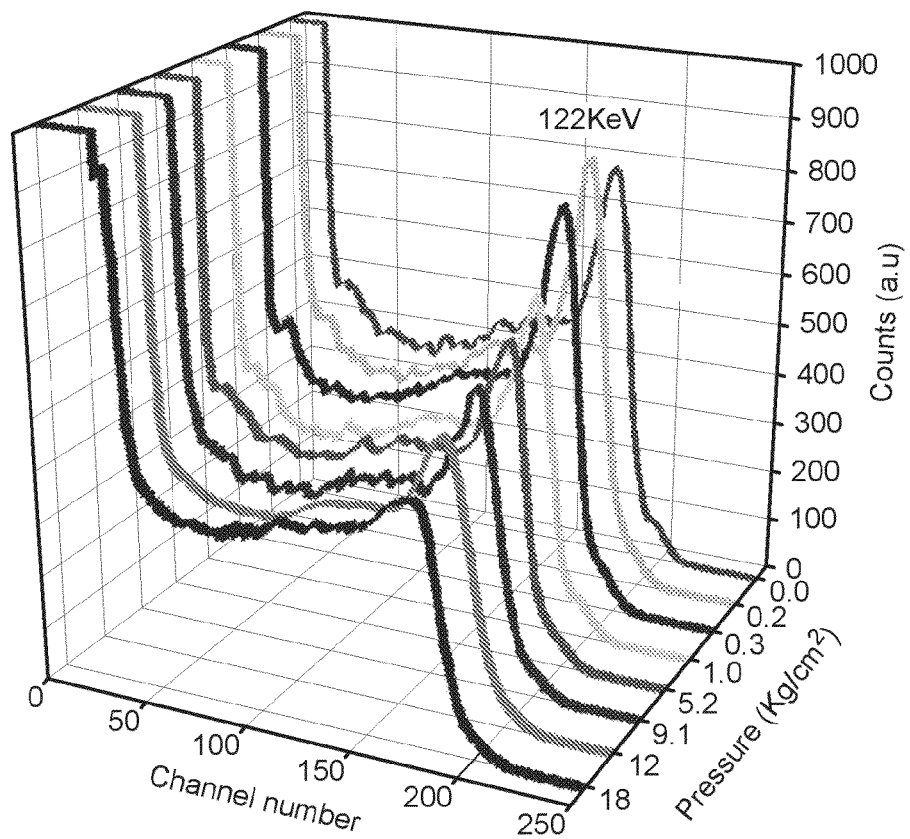
FIG. 2 is a graphical representation of $^{57}Co$ gamma ray performance for a planar detector under different pressures applied on the contact side.
Figure 3:
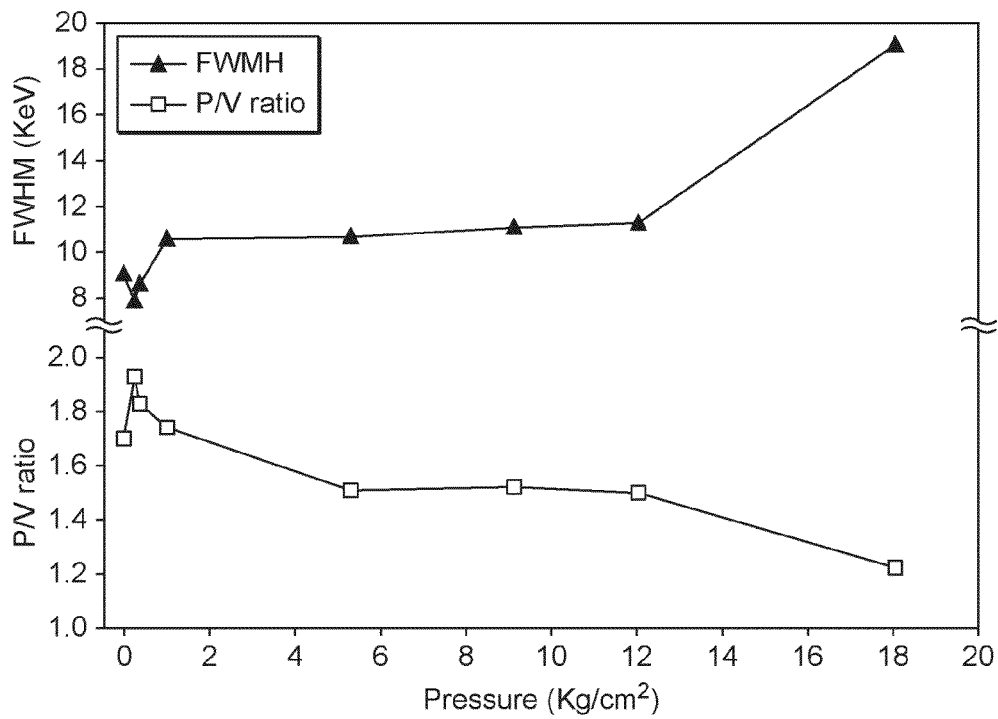
FIG. 3 is a graphical representation of Energy resolution (FWHM) and Peak to valley (P/V) for a planar detector under different pressures applied on the contact side.
Figure 4:
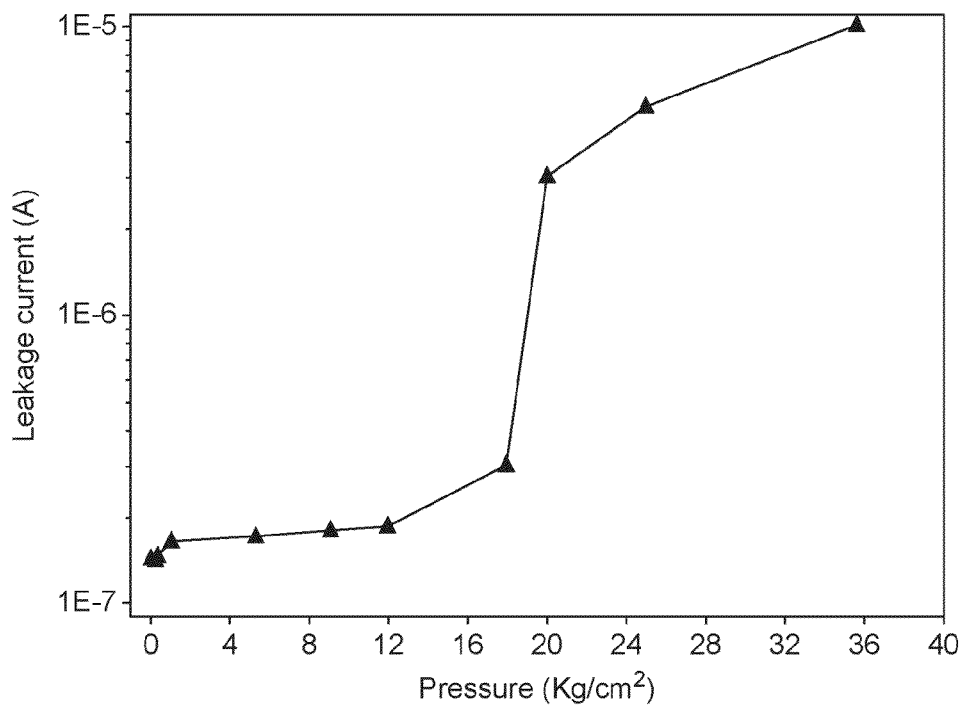
FIG. 4 is a graphical representation of leakage current at V=300V for a planar detector at different pressures applied on the contact side.

An example of the device performance under various pressures has been given on the FIGS. 2, 3 and 4. In each case a controlled pressure has been applied uniformly on a planar detector and on the metallic contact side as shown the FIG. 1a.

FIGS. 2 and 3 demonstrate the variation of the $^{57}Co$ gamma ray performance under different pressures. As we can notice and under a small pressure (250 g in this case), an improvement of the detector performance in term of energy resolution (FWHM) and peak to valley (P/V) is observed. At higher pressures, a deterioration of the detector performance was noticed.

FIG. 4 shows the leakage current at 300V of applied voltage and under various pressures. As with FIGS. 2 and 3, similar behaviour was noticed for the detector leakage current where it varies with the applied pressures on the detector.

It can be seen from the above example for a planar detector that the effect of the application of a controlled stress can be to improve the detector performance, in particular once an optimised applied stress is determined. This can be explained by a variation in term of concentration and energy of the intrinsic defects leading to a better compensation and so to an improvement of the electrical field throughout the detector.

The detailed example given applied a controlled pressure to a planar detector. The same approach can be used for the pixellated detector either in that a uniform pressure on the whole pixellated area can be applied or an individual pressure by pixel can be applied to correct and improve the electrical performance for each pixel, for example to accommodate a non-uniform semiconductor material performance.

The detailed example given applied a controlled pressure to the face of the device (as in FIG. 1a). Alternatively a controlled stress can also be applied on the edge side of the device (as in FIG. 1b) leading to a similar effect.

The invention claimed is:
1. A semiconductor detector device comprising:
a detector element comprising at least one active detector layer of piezoelectric semiconductor material;
a stress inducing element arranged to act in use on the detector element to generate therein a predetermined pattern of stress, and consequently a predetermined electrical field;
wherein the detector element is a pixellated detector element and has a micropixellated pattern of a predetermined repeat pitch, and the stress inducing element is so configured as to generate a microstress pattern with the same repeat pitch; and wherein the stress inducing element is configured to induce an inherent pre-stress in the detector element to induce a mechanical stress pattern therein.

2. The device in accordance with claim 1, wherein the stress inducing element is adapted in use to act mechanically upon the detector element to produce a mechanical stress pattern there in use.

3. The device in accordance with claim 1, wherein the stress inducing element comprises a supporting substrate mechanically engaged with the detector element in such a manner as to induce a mechanical stress pattern therein.

4. The device in accordance with claim 1, wherein the stress inducing element includes a force applicator co-operatively disposed with the detector element so as to mechanically engage selectively in use with the detector element to apply a force thereto and generate a mechanical stress pattern therein.

5. The device in accordance with claim 4, wherein the force applicator comprises a shaped surface structure having a suitable patterned arrangement of projections and recesses so as to generate stress patterns of a predetermined nature when pressed against the detector element.

6. The device in accordance with claim 1, wherein the stress inducing element is adapted to induce predetermined variable stress patterns in use in the detector element to deliberately generate predetermined variable electrical field patterns therein.

7. The device in accordance with claim 1, wherein the detector element is a planar detector element.

8. The device in accordance with claim 1, wherein the stress inducing element is adapted to induce a stress pattern to at least one of complement and enhance small pixel effect.

9. The device in accordance with claim 1, wherein the detector element comprises one or more compound semiconductors selected from cadmium telluride, cadmium zinc telluride (CZT), cadmium manganese telluride (CMT), mercury cadmium telluride, mercury zinc telluride and alloys thereof, gallium arsenide, indium gallium arsenide, lanthanum bromide, thorium bromide.

10. The device in accordance with claim 9, wherein the detector element comprises crystalline $Cd_{1-(a+b)}Mn_aZn_b Te$ where a+b<1 and at least one of a and b may be zero.

11. A method of operation of a detector device, the method comprising the steps of:
provﾠiding a detector device comprising at least one detector element having at least one active detector layer of a piezoelectric semiconductor material;
operating the detector element whilst inducing therein a predetermined stress pattern and consequently inducing therein a predetermined pattern of electrical field;
wherein the detector is a pixellated detector having a micropixellated pattern of a predetermined repeat pitch and the predetermined stress pattern is generated on a pixel scale as a microstress pattern with the same repeat pitch; and
wherein a stress inducing element is configured to induce an inherent pre-stress in the detector element to induce a mechanical stress pattern therein.

12. The method of claim 11, wherein the step of inducing a predetermined stress pattern comprises causing a stress inducing element to act mechanically upon the detector element to produce a mechanical stress pattern therein.

13. The method of claim 11, wherein the step of inducing a predetermined stress pattern comprises preparing the detector element in such manner as to induce an inherent pre-stress therein to produce a mechanical stress pattern therein.

14. The method of claim 11, wherein the step of inducing a predetermined stress pattern comprises disposing the detector element on a supporting substrate mechanically engaged with the detector element in such a manner as to induce a mechanical stress pattern therein.

15. The method of claim 11 comprising, during operation of a detector device incorporating a detector element having at least one piezoelectric semiconductor detector layer, generating an appropriately controlled stress pattern and thereby an appropriately controlled patterned electric field to modify an electrical behaviour of the detector element.

16. The method of claim 15 comprising generating an appropriately controlled stress pattern and thereby an appropriately controlled patterned electric field to modify detector performance in specific areas of the detector.

17. The method of claim 11 comprising inducing a predetermined pattern of strain such as to generate a patterned electrical field which complements the small pixel effect in the pixellated detector.

18. A method of fabrication of a detector device, the method comprising:
providing a detector device comprising at least one detector element having at least one active detector layer of a piezoelectric semiconductor material;
associating with the at least one detector element a stress inducing element arranged to act in use on the detector element to generate therein a predetermined pattern of stress, and consequently a predetermined electrical field;
wherein the detector is a pixellated detector having a micropixellated pattern of a predetermined repeat pitch and the stress inducing element arranged to act in use on the detector element to generate a predetermined pattern on a pixel scale as a microstress pattern with the same repeat pitch; and
wherein the stress inducing element is configured to induce an inherent pre-stress in the detector element to induce a mechanical stress pattern therein.

19. The method of claim 18, wherein the step of associating a stress inducing element with the detector element comprises providing a stress inducing element adapted to act mechanically upon the detector element to produce a mechanical stress pattern therein.

20. The method of claim 18, wherein the step of associating a stress inducing element with the at least one detector element comprises preparing the detector in such manner as to induce an inherent pre-stress therein to produce a mechanical stress pattern therein.

21. The method of claim 20, wherein the step of associating a stress inducing element with the detector element comprises disposing the detector on a supporting substrate mechanically engaged with the detector element in such a manner as to induce a mechanical stress pattern therein.

* * * * *